United States Patent [19]

Haq

[11] Patent Number: 4,744,834

[45] Date of Patent: May 17, 1988

[54] PHOTORESIST STRIPPER COMPRISING A PYRROLIDINONE, A DIETHYLENE GLYCOL ETHER, A POLYGLYCOL AND A QUATERNARY AMMONIUM HYDROXIDE

[76] Inventor: Noor Haq, 20291 Saratoga-Los Gatos Road, Saratoga, Calif. 95070

[21] Appl. No.: 857,841

[22] Filed: Apr. 30, 1986

[51] Int. Cl.$^4$ .................. C09D 9/00; C11D 7/52; C23D 17/00; G03C 11/12
[52] U.S. Cl. ...................... 134/38; 252/153; 252/158; 252/170; 252/171; 252/542; 252/DIG. 8; 430/256; 430/329; 430/331
[58] Field of Search .............. 252/158, 170, 171, 542, 252/153, DIG 8; 134/38

[56] References Cited

U.S. PATENT DOCUMENTS 3,673,099 6/1972 Corby .................. 252/156
4,276,186 6/1981 Bakos .................. 252/158
4,428,871 1/1984 Ward .................... 252/542

*Primary Examiner*—Dennis Albrecht
*Attorney, Agent, or Firm*—Fliesler, Dubb, Meyer & Lovejoy

[57] ABSTRACT

A composition of matter is set forth which is useful for removing a photoresist material from a substrate. The composition comprises 10 to 90% by weight of a 2-pyrrolidinone compound of the formula

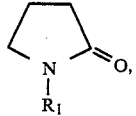

10 to 30% by weight of a diethylene glycol monalkyl ether of the formula

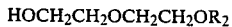

1 to 10% by weight of a polyglycol having a molecular weight from about 200 to about 600, and 0.5 to 4% of a quaternary ammonium hydroxide of the formula

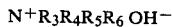

wherein $R_1$ is hydrogen, alkyl of 1 to 3 carbon atoms or hydroxyalkyl of 1 to 3 carbon atoms, $R_2$, $R_3$ and $R_4$ are the same or different alkyl groups of 1 to 4 carbon atoms, $R_5$ is an alkyl group of 1 to 18 carbon atoms, and $R_6$ is an alkyl group of 1 to 18 carbon atoms, phenyl, alkylphenyl wherein the alkyl is of 1 to 18 carbon atoms, benzyl, or alkylbenzyl wherein the alkyl is of 1 to 18 carbon atoms.

10 Claims, No Drawings

PHOTORESIST STRIPPER COMPRISING A PYRROLIDINONE, A DIETHYLENE GLYCOL ETHER, A POLYGLYCOL AND A QUATERNARY AMMONIUM HYDROXIDE

DESCRIPTION

1. Field of Invention

The present invention relates to a composition of matter useful for removing a photoresist material from a substrate and to a method of removing a photoresist material utilizing such a composition. The substrate is generally in the nature of a semiconductor device.

2. Background Art

Integrated circuit manufacturing technology utilizes positive photoresist type materials for photolithographically delineating patterns on substrates, which later on in the process are etched by wet or dry etching techniques and left permanently or removed temporarily. The positive photoresist materials are spun on or applied with different methods on to the substrates. Then the substrates are exposed with u.v. light utilizing different types of exposure machines. After exposure, the substrates go through a development process where, due to selective dissolution of certain areas, a pattern is developed. The resist material in certain areas is completely removed.

The remaining resist material is further exposed to dry or wet etching. This process is essential to define the pattern and to leave behind dielectric or metallic film to be utilized later on in the process sequence. Before this etching process the photoresist materials may be treated with a blanket of deep u.v. light, at very high temperatures ranging from 140° C. to 300° C. for 30 seconds to 90 seconds. This treatment improves the resist selectivity and provides better etching and dimensional controls.

It is necessary in such a full lithographic process that the photoresist material, following pattern delineation, be evenly and completely removed from all unexposed areas, so as to permit further operations. Even the partial remains of a resist coating in an area to be processed is undesirable. Leftover residue of the photoresist material can have detrimental yield problems.

In the past, resist materials have been removed by one or more of the following: halogenated hydrocarbons, such a methylene chloride, amines and their derivatives such as dimethylsulfide, dimethylformamide, N-methyl-2-pyrrolidinone, glycol ethers such as ethylene glycol monomethyl ether, ethanol and the acetates thereof; ketones such as methyl ethyl ketone and acetone and materials such as isopropyl alcohol, sulfuric acid, ammonium persulfate and mixtures of caustic and phenol derivatives as well as various other materials.

There are several drawbacks with the use of the aforementioned photoresist material removing compositions. One of the major disadvantages with the above-mentioned methods of stripping photoresist is that they do not remove deep u.v. baked photoresist, or they leave behind traces of resist film. The other disadvantages are: undesirable flammability, volatility, odor or toxicity, drainage of possibly dangerous chemicals in city sewer systems and attack of underlying metal films. Additionally, such strippers are not effective against resist materials that are subject to a severe post baking operation thereby limiting their usefulness. In some of the strippers water is present which may be extremely detrimental to the underlying substrate.

The present invention is directed to solving one or more of the problems as set forth above.

DISCLOSURE OF INVENTION

In accordance with the present invention a composition of matter is set forth which is useful for removing a photoresist material from a substrate. The composition of a matter comprises 10 to 90% by weight of a 2-pyrrolidinone compound of the formula:

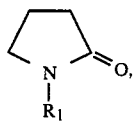

10 to 30% by weight of diethylene glycol monoalkyl ether of the formula

1 to 10% by weight of a polyglycol having a molecular weight from about 200 to about 600; and 0.5 to 4% by weight of a quaternary ammonium hydroxide of the formula

wherein $R_1$ is hydrogen, alkyl of 1 to 3 carbon atoms or hydroxyalkyl of 1 to 3 carbon atoms, $R_2$ is alkyl of 1 to 4 carbon atoms, $R_3$ and $R_4$ are the same or different alkyl groups of 1 to 4 carbon atoms, $R_5$ is an alkyl group of 1 to 18 carbon atoms, and $R_6$ is an alkyl group of 1 to 18 carbon atoms, phenyl, alkylphenyl wherein the alkyl is of 1 to 18 carbon atoms, benzyl, or alkylbenzyl wherein the alkyl is of 1 to 18 carbon atoms.

In accordance with another embodiment of the present invention a method is set forth of removing a resist material from a substrate which comprises rinsing the substrate with the above defined composition.

The composition and method of the present invention provide a suitable photoresist composition and method in which the hereinbefore mentioned disadvantages and drawbacks of the prior art are eliminated or substantially reduced and in which the range of usefulness of the stripping composition is greatly extended in that the stripping composition provides capabilities not demonstrated before and not possible by the use of individual components.

BEST MODE FOR CARRYING OUT INVENTION

The composition of the present invention includes 10% to 90% by weight of a 2-pyrrolidinone compound of the formula

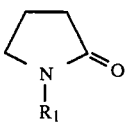

wherein $R_1$ is hydrogen, alkyl of 1 to 3 carbon atoms or hydroxyalkyl of 1 to 3 carbon atoms. Examples of 2-pyrrolidinone compounds of the above set out formula which are suitable for use in the composition of the present invention include 2-pyrrolidinone, 1-methyl-2-pyrrolidinone, 1-ethyl-2-pyrrolidinone, 1-propyl-2-pyrrolidinone, 1-hydroxymethyl-2-pyrrolidinone, 1-hydroxyethyl-2-pyrrolidinone, and 1-hydroxypropyl-2-pyrrolidinone. The composition of the present invention must include 10 to 90% by weight, preferably 50 to 80% by weight and most preferably about 75% weight of the 2-pyrrolidinone compound, the weight percents being based upon the weight of the total composition of matter.

The second component of the composition of matter of the present invention is a diethylene glycol monoalkyl ether. The diethylene glycol monoalkyl ethers that may be employed in the composition of the invention are those of the general formula

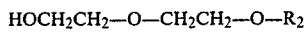
$$HOCH_2CH_2-O-CH_2CH_2-O-R_2$$

wherein $R_2$ is alkyl of 1 to 4 carbon atoms. Examples of such compounds which are useful in the compositions of the present invention are the monomethyl-, monoethyl-, and monobutyl- ethers of diethylene glycol. Especially preferred is diethylene glycol monobutyl ether. The amount of the diethylene glycol monoalkyl ether muust be within the range from about 10 to 30% by weight, preferably 15 to 30% by weight and most preferably about 20% weight of the total composition of matter.

The third necessary component of the composition of matter of the present invention is a polyglycol. A preferred polyglycol is polyethylene glycol of molecular weight about 200. However, more generally, polyglycols of molecular weight of 200 to 600 can be used. List of usable glycols include polyglycols formed from glycols are ethylene glycol, diethylene glycol, triethylene glycol, tetraethylene glycol, propylene glycol, dipropylene glycol and tripropylene glycol. The composition of matter of the present invention must include 1 to 10% by weight, more preferably about 5% by weight, of the polyglycol compound.

The fourth necessary component of the composition of matter of the present invention is a quaternary ammonium hydroxide of the formula

$$N^+R_3R_4R_5R_6OH^-$$

wherein $R_3$ and $R_4$ are the same or different alkyl groups of 1 to 4 carbon atoms, $R_5$ an alkyl group of 1 to 18 carbon atoms, and $R_6$ is an alkyl group of 1 to 18 carbon atoms, phenyl, alkylphenyl wherein the alkyl is of 1 to 18 carbon atoms, benzyl, or alkylbenzyl wherein the alkyl is of 1 to 18 carbon atoms. The composition of the present invention must include 0.5% to 4% by weight, more preferably 1% to 2% by weight, and most preferably about 1.2% by weight of the quaternary ammonium hydroxide. Specific examples of quaternary ammonium hydroxides include tetramethyl ammonium hydroxide, tetraethyl ammonium hydroxide, benzyl trimethyl ammonium hydroxide, phenyl trimethyl ammonium hydroxide, dodecyl trimethyl ammonium hydroxide, hexadecyl trimethyl ammonium hydroxide, octadecyl trimethyl ammonium hydroxide, dodecyl triethyl ammonium hydroxide, hexadecyl triethyl ammonium hydroxide, octadecyl triethyl ammonium hydroxide, dodecyl tri-n-propyl ammonium hydroxide, docecyl tri-isopropyl ammonium hydroxide, benzyl dimethyl hexadecyl ammonium hydroxide, dimethyl ethyl hexadecyl ammonium hydroxide, p-dodecylbenzyl trimethyl ammonium hydroxide and benzyl dimethyl octadecyl ammonium hydroxide.

A composition which has been found to work particularly well comprises about 74% by weight of the 2-pyrrolidinone, about 5% by weight of the polyglycol, about 20% by weight of the diethylene glycol monoalkyl ether and about 1% by weight of the quaternary ammonium hydroxide.

It is to be understood that it is not necessary that all of the 2-pyrrolidinone compound, the diethylene glycol monoalkyl ether, the polyglycol, or the quaternary ammonium hydroxide be a single composition. That is, within each of the four essential classes of ingredients of the composition of the matter of the present invention, mixtures may be utilized instead of pure compounds.

The photoresist removing composition of the present invention may be utilized generally in the same manner as are other photoresist removing compositions. That is, it may be used to strip off a photoresist material from a substrate by contacting the substrate and the composition. The photoresist may be stripped, for example, by the hot pots method. In this method the stripper composition of the invention is placed in a hot pot, heated from room temperature to 110° C. substrates which are to be stripped are placed in the hot bath for about 2 to 10 minutes, rinsed off with deionized water and then spun dry. Alternatively, an automated stripper may be used. In such a case the stripper composition is an automated system. Where substrates are held in cassettes. Stripper solution is routed through a hot tank and sprayed on to the cassettes. The cassettes are spun at 3000 to 4000 rpm. Photoresist is stripped by mechanical action and by chemical reaction.

The composition of the present invention is very effective in stripping deep u.v. baked photoresist. Thus, it is particularly useful when photoresist coated semiconductor wafers are exposed to blanket u.v. exposure for 30 to 90 seconds at a temperature in the range from 120° C. to 300° C. and then baked at 120° C. to 300° C. in a conventional convection oven. After such wafers have been etched in plasma systems the resist can be removed utilizing the unique composition of the present invention. The composition of the present invention is also very effective in stripping photoresist from back lap wafers. Back lap wafers are provided when wafers are deposited with glass, then are photomasked to open pads for bonding processes. Glass is etched by acid and rinsed with deionized water. The photoresist may then be stripped and cleaned utilizing a composition in accordance with the present invention. Also, the composition of the present invention is very effective in stripping photoresist from wafers after high energy, high current, high dose implants. Such wafers are prepared when bare silicon wafers have an oxide layer of 100 angstroms to 1200 angstroms thermally grown upon them. Then $Si_3N_4$, approximately 800 angstroms to 1200 angstroms in thickness, is grown or deposited on the oxide layer. The wafers are then subjected to the photomasking operation in which photoresist is applied and a pattern is delineated. The wafers are then subjected to high energy, high current, high dose implantation. The substrates are implanted with different impurities such as arsenic, phosphorous, boron, antimony, zinc or the like. The dose levels used are in the range of $0.5 \times 10^{11}$ to $5 \times 10^{16}$ atoms/cm$^2$. The wafers are subjected to high energy and high current. During this process the photoresist becomes very hard and is very difficult to remove with conventional techniques. The composition of the present invention efficiently cleans and strips the hardened resist from such substrates.

The composition of the present invention is very effective in cleaning photoresist from plasma etched wafers from the so-called double metal process. Double metal processes are used in semiconductor technology to reduce the die size. By doing so, the metal interconnects are shortened and the speed of the chip is improved. In the double metal process it is very difficult to clean photoresist from small vias and in between the metal lines. The composition of the present invention effectively enters the vias and the space between the metal lines and removes the photoresist in an efficient manner.

The stripping efficiencies of a composition in accordance with the present invention and of two stripping compositions which included one and three of the ingredients of the composition of the present invention were experimentally determined. The compositions tested (A, B and C) had the following makeup (all %'s by weight):

A: N-methyl-2-pyrrolidinone
B: 75% N-methyl-2-pyrrolidinone, 5% polyethylene glycol, 20% diethylene glycol monomethyl ether
C: 74.1% N-methyl-2-pyrrolidinone, 4.9% polyethylene glycol, 19.8% diethylene glycol monobutyl ether, and 1.2% tetramethyl ammonium hydroxide The photoresist being stripped was applied in a thickness of 2 microns on 2 inch square ceramic wafers which had been sputter coated with about 500 angstroms of a titanium/tungsten alloy. The photoresist was exposed and developed, then was UV flood exposed at 19 mw/cm$^2$ using 400 nm light for 30 seconds, then was hardbaked at 125° C. for 30 minutes. Each of the identically treated test parts was then placed in a dessicator for 30 minutes. They were then removed and again hardbaked at 125° C. for 30 minutes.

Two wafers, processed as described above, were immersed in each of compositions A, B and C, with mild agitation, for compositions B and C and at 90° C. for composition A for various times between 5 and 10 minutes. After the immersion each pair of substrates was visually examined for evidence of a residual resist pattern. The wafers immersed in composition C showed no residual pattern. The wafers immersed in compositions A and B did show such a pattern. These four wafers which had been treated with compositions A and B were then immersed in composition C for 3 minutes at 40° C. with mild agitation. On removal from composition C the six wafers no longer exhibited a residual pattern.

Industrial Applicability

The composition and method of the present invention are particularly useful for cleaning photoresist off of semiconductor wafers.

Other aspects, objectives, and advantages of the present invention can be obtained from a study of the drawings, the disclosure and the appended claims.

I claim:

1. A composition of matter useful for removing a photoresist material from a substrate, comprising:
   50 to 80% by weight of a 2-pyrrolidinone compound of the formula

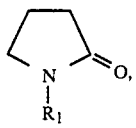

15 to 30% by weight of a diethylene glycol monoalkyl ether of the formula $HOCH_2CH_2OCH_2CH_2OR_2$ 1 to 10% by weight of a polyglycol having a molecular weight from about 200 to about 600; and
   0.5 to 4% by weight of a quaternary ammonium hydroxide of the formula $N^+R_3R_4R_5R_6\ OH^-$ wherein $R_1$ is hydrogen, alkyl 1 to 3 carbon atoms or hydroxyalkyl of 1 to 3 carbon atoms, $R_2$ is alkyl of 1 to 4 carbon atoms, $R_3$ and $R_4$ are the same or different alkyl groups of 1 to 4 carbon atoms, $R_5$ is an alkyl group of 1 to 18 carbon atoms, and $R_6$ is an alkyl group of 1 to 18 carbon atoms, phenyl, alkyl phenyl wherein the alkyl is of 1 to 18 carbon atoms, benzyl, or alkylbenzyl where the alkyl is of 1 to 18 carbon atoms.

2. A composition as set forth in claim 1, wherein said quaternary ammonium hydroxide is in an amount of 1 to 2% by weight.

3. A composition of matter as set forth in claim 1, wherein said 2-pyrrolidinone compound is 2-pyrrolidinone, 1-methyl-2-pyrrolidinone, 1-ethyl-2-pyrrolidinone, 1-propyl-2-pyrrolidinone, 1-hydroxymethyl-2-pyrrolidinone, 1-hydroxyethyl-2-pyrrolidinone, or 1-hydroxypropyl-2-pyrrolidinone, said diethylene glycol monoalkyl ether is a monomethyl-, monoethyl-, or monobutyl- ether of diethylene glycol, said polyglycol is polyethylene glycol and said quaternary ammonium hydroxide is tetramethyl ammonium hydroxide, tetraethyl ammonium hydroxide, tetrabutyl ammonium hydroxide, benzyl trimethyl ammonium hydroxide, phenyl trimethyl ammonium hydroxide, dodecyl trimethyl ammonium hydroxide, hexadecyl trimethyl ammonium hydroxide, octadecyl trimethyl ammonium hydroxide, dodecyl triethyl ammonium hydroxide, hexadecyl triethyl ammonium hydroxide, octadecyl triethyl ammonium hydroxide, dodecyl tri-n-propyl ammonium hydroxide, docecyl tri-isopropyl ammonium hydroxide, benzyl dimethyl hexadecyl ammonium hydroxide, dimethyl ethyl hexadecyl ammonium hydroxide, p-dodecylbenzyl trimethyl ammonium hydroxide or benzyl dimethyl octadecyl ammonium hydroxide.

4. A composition of matter as set forth in claim 3, wherein said quaternary ammonium hydroxide is in an amount of 1 to 2% by weight.

5. A composition of matter as set forth in claim 3, wherein said 2-pyrrolidinone is in an amount of about 74% by weight, said diethylene glycol monoalkyl ether is in an amount of about 20% by weight, said polyglycol is in an amount of about 5% by weight, and said quaternary ammonium hydroxide is in an amount of about 1% by weight.

6. A method of removing a photoresist material from a substrate comprising contacting said substrate with the composition of claim 5.

7. A method of removing a photoresist material from a substrate comprising contacting said substrate with the composition of claim 4.

8. A method of removing a photoresist material from a substrate comprising contacting said substrate with the composition of claim 3.

9. A method of removing a photoresist material from a substrate comprising contacting said substrate with the composition of claim 2.

10. A method of removing a photoresist material from a substrate comprising contacting said substrate with the composition of claim 1.

* * * * *

UNITED STATES PATENT AND TRADEMARK OFFICE
CERTIFICATE OF CORRECTION

PATENT NO. : 4,744,834

DATED : May 17, 1988

INVENTOR(S) : Noor Haq

It is certified that error appears in the above-identified patent and that said Letters Patent is hereby corrected as shown below:

Column 2, line 10: "composition of a matter" should be "composition of matter"

Column 2, line 29: "$N^+R_3R_4R_5R_6OH^{31}$" should be "$N^+R_3R_4R_5R_6OH^-$"

Signed and Sealed this

Third Day of January, 1989

Attest:

DONALD J. QUIGG

*Attesting Officer*   *Commissioner of Patents and Trademarks*